United States Patent
DeSimone et al.

(10) Patent No.: US 8,253,726 B1
(45) Date of Patent: Aug. 28, 2012

(54) SYSTEMS AND METHODS FOR MODIFYING THREE DIMENSIONAL GEOMETRY USING AN ARBITRARY CROSS-SECTION PLANE

(75) Inventors: Frank DeSimone, Carlisle, MA (US); Blake Courter, Somerville, MA (US); David Taylor, Cambridge (GB); Max Eskin, Somerville, MA (US); Daniel Dean, Acton, MA (US)

(73) Assignee: SpaceClaim Corporation, Inc., Concord, MA (US)

( * ) Notice: Subject to any disclaimer, the term of this patent is extended or adjusted under 35 U.S.C. 154(b) by 1045 days.

(21) Appl. No.: 11/971,756

(22) Filed: Jan. 9, 2008

(51) Int. Cl.
*G06T 15/00* (2006.01)
*G06T 17/00* (2006.01)

(52) U.S. Cl. ........................ 345/419; 345/420
(58) Field of Classification Search .................. None
See application file for complete search history.

(56) References Cited

U.S. PATENT DOCUMENTS

| | | | |
|---|---|---|---|
| 4,858,150 A | 8/1989 | Aizawa et al. | |
| 5,077,608 A | 12/1991 | Dubner | |
| 5,668,939 A | 9/1997 | Numao et al. | |
| 5,680,523 A | 10/1997 | Watkins et al. | |
| 5,741,215 A | 4/1998 | D'Urso | |
| 5,945,995 A | 8/1999 | Higuchi et al. | |
| 6,392,645 B1 | 5/2002 | Han et al. | |
| 6,879,323 B1 | 4/2005 | Takezawa et al. | |
| 7,031,790 B2 | 4/2006 | Hill | |
| 7,062,416 B1 | 6/2006 | Arita et al. | |
| 7,068,269 B2 | 6/2006 | Roberts et al. | |
| 7,315,304 B2 | 1/2008 | Liang et al. | |
| 7,324,103 B2 * | 1/2008 | Stewart et al. | 345/420 |
| 7,352,369 B2 | 4/2008 | Spicer et al. | |
| 7,366,581 B2 | 4/2008 | Hill et al. | |
| 2001/0043209 A1 | 11/2001 | Nagakura | |
| 2003/0201992 A1 | 10/2003 | Wang et al. | |
| 2003/0210242 A1 | 11/2003 | Kripac | |

(Continued)

FOREIGN PATENT DOCUMENTS

FR 2754370 4/1998

(Continued)

OTHER PUBLICATIONS

Owada, S. et al., A Sketching Interface for Modeling the Internal Structures of 3D Shapes, in Proceedings of the 4th International Symposium on Smart Graphics (2003), pp. 49-57.*

(Continued)

*Primary Examiner* — Daniel Washburn
*Assistant Examiner* — Donna Ricks
(74) *Attorney, Agent, or Firm* — Wilmer Cutler Pickering Hale and Dorr LLP

(57) ABSTRACT

Embodiments of the invention comprise methods and systems for modifying the geometry data of a CAD object through modification of an arbitrary cross section, the CAD object being stored within a computer aided design modeling system. The method includes receiving, from a user the position and orientation of a cross section plane, the cross section plane being arbitrarily positioned relative to the orientation of a CAD object, and wherein the arbitrarily positioned and oriented plane is intersecting the CAD object. The CAD system generates a user modifiable two dimensional cross section from the intersection of the cross section plane and the CAD object, the cross section having a plurality user modifiable control elements. Changes to the control elements are correspondingly made to the cross section plane and the CAD object.

18 Claims, 11 Drawing Sheets

U.S. PATENT DOCUMENTS

| | | |
|---|---|---|
| 2003/0210244 A1 | 11/2003 | Sasago et al. |
| 2004/0096799 A1 | 5/2004 | Hughes et al. |
| 2004/0174359 A1 | 9/2004 | Takagi |
| 2006/0017723 A1 | 1/2006 | Baran et al. |
| 2006/0038812 A1* | 2/2006 | Warn et al. .................. 345/419 |
| 2006/0202983 A1 | 9/2006 | Kulkarni |
| 2006/0250393 A1 | 11/2006 | Tsang et al. |
| 2006/0284869 A1 | 12/2006 | Kasprzak et al. |
| 2007/0057938 A1 | 3/2007 | Usami et al. |
| 2007/0064016 A1 | 3/2007 | Hillerin et al. |
| 2007/0273688 A1 | 11/2007 | Chen et al. |
| 2007/0291000 A1 | 12/2007 | Liang et al. |

FOREIGN PATENT DOCUMENTS

| | | |
|---|---|---|
| JP | 02148273 | 6/1990 |
| JP | 9062721 | 3/1997 |
| JP | 9223248 | 8/1997 |
| JP | 2005302058 | 10/2005 |
| JP | 2006106938 | 4/2006 |
| JP | 2007080080 | 3/2007 |
| WO | WO 2005078666 | 8/2005 |

OTHER PUBLICATIONS

Gould, Lawrence S. "PC-based CAD for the Rest of Us." Automotive Design and Production, 1999, 4 pages.

Owen, "Algeraic Solution for Geometry from Dimensional Constraints," Proceedings of the 1st ACM Symposium of Solid Modeling and CAD/CAM Applications, pp. 397-407, 1991.

Cohen, L.D. and Cohen, I. et al., "A Finite Element Method Applied to New Active Contour Models and 3D Reconstruction from Cross Sections", IEEE, pp. 587-591 (1990).

Wong, S.H. and Chan, K.L., "3-Dimensional Medical Image Reconstruction From Serial Cross Section," IPA97, Jul. 15-17, 1997, Conference Publication No. 443 IEE, pp. 525-529 (1997).

Shreedhara, K.S. and Indira S.P., "Construction of 3-D Objects using 2-D Cross Sectional Data and Curves," Dept. of CS&E, Univ. BDT College of Eng. pp. 630-631 (2006).

Tazawa, S. et al., "3-D Topography Simulation of Via Holes Using Generalized Solid Modeling," IEEE, pp. 7.4.1 - 7.4.4 (1992).

* cited by examiner

SYSTEMS AND METHODS FOR MODIFYING THREE DIMENSIONAL GEOMETRY USING AN ARBITRARY CROSS-SECTION PLANE

BACKGROUND OF THE INVENTION

1. Field of the Invention

This invention relates to modifying the cross-sections of solid and surface geometry formed by an arbitrary intersecting plane or surface in an intuitive manner.

2. Prior art

Objects in a CAD system can be represented in a parameter-based way or in a geometry-based way. In a parameter-based representation, the object is modeled as an object along with a set of features and history that define the object. In a geometry-based representation, the object is simply represented as a set of geometric data.

Most modern CAD systems offer the ability to create cross-sections. Two dimensional (2D) CAD systems (such as AutoCAD) allow the user to draw representations of cross-sections of solid objects, but do not have 3D capabilities, and the cross-section serves only as an example of what a true cross-section would be.

Three dimensional (3D) CAD systems (such as Solid-Works) are able to create and edit solids using cross-sections. However, the cross-section planes that can be used to edit solids must be those that define the faces of solid objects. For example, a solid object that have been created by extrusion, or by revolving a cross-section. No other cross section, except the one use to create the object, can be used for creating or editing purposes. The cross-sections cannot be placed in any position that intersects with the solid object. Arbitrarily oriented and positioned cross-sections can be placed through solid objects for the purpose of viewing the geometry, but the intersection of the solid with the cross-section cannot be used to modify the object unless the cross-section is coincident with the cross section that defined the geometry in the first place.

SUMMARY

Embodiments of the invention include a method for modifying the geometry data of a geometry-only format CAD object through modification of an arbitrary cross section, the CAD object being stored within a computer aided design modeling system without related history information. The method includes displaying a plurality of CAD objects, each with a corresponding position and orientation within the three dimensional modeling space of the computer aided design modeling system, and displayed within a graphical user interface of the computer aided design modeling system. The method further includes receiving, from a user of the computer aided design modeling system, the position and orientation of a cross section plane within the three dimensional modeling space of the computer aided design modeling system, the cross section plane being arbitrarily positioned relative to the orientation of one of the CAD objects, and wherein the arbitrarily positioned and oriented plane is intersecting the CAD object. The computer aided design modeling system generates a user modifiable two dimensional cross section from the intersection of the cross section plane and the CAD object, wherein the cross section plane is arbitrarily positioned and oriented relative to the CAD object, and wherein the generated two dimensional cross section comprises a plurality of user modifiable control elements. The system receives a modification to at least one of the user modifiable control elements, and makes a corresponding modification to the two dimensional cross section in response to the modification to the control element. The method also includes updating the geometry data of the CAD object such that changes to the two dimensional cross section are reflected in the updated geometry, and performing such updates without recording history information.

In other embodiments of the invention, the user modifiable control elements are comprised of a plurality of points and a plurality of lines. In yet other embodiments the geometry is updated by creating a new face based on the changes to the two dimensional cross section, and then updating the geometry data of the CAD object using the new face.

DETAILED DESCRIPTION

Figure 1:
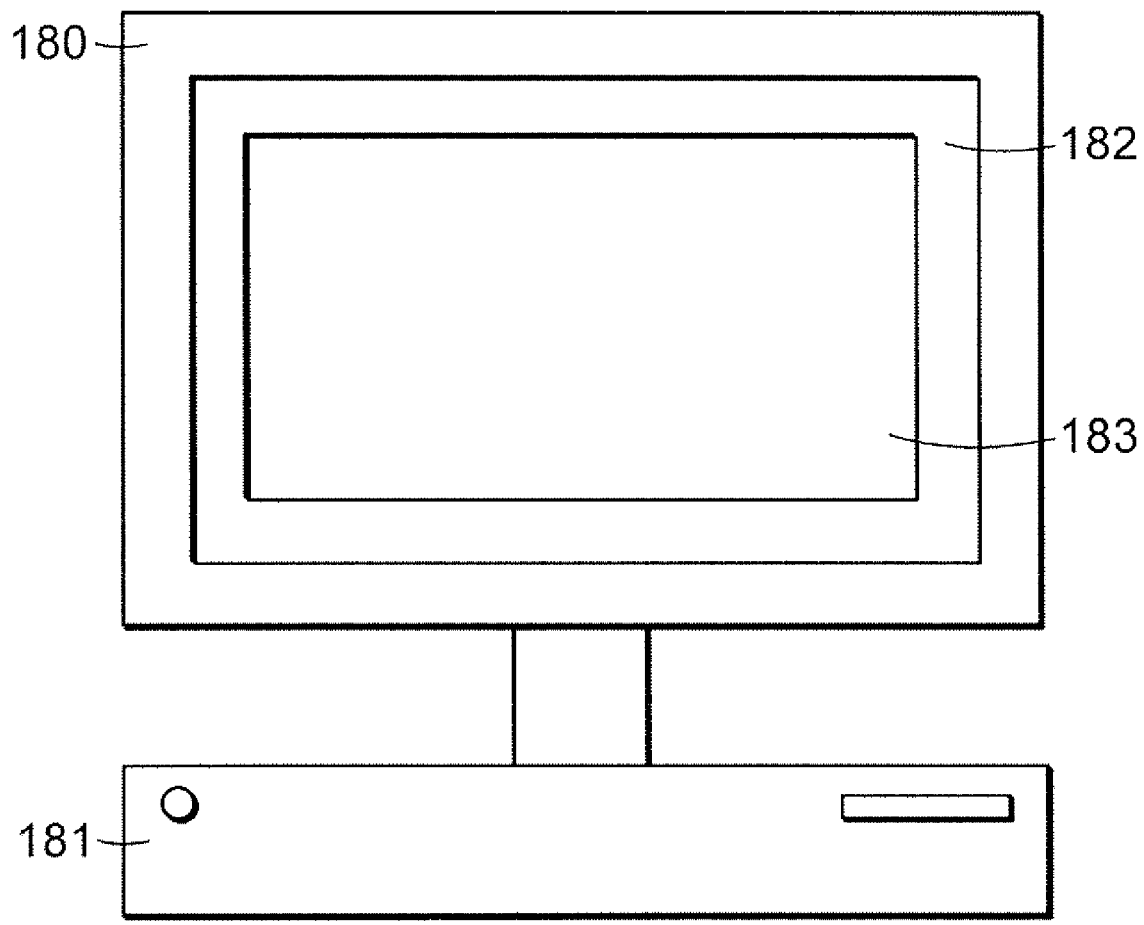
FIG. 1 shows a computer system on which the section mode tool in accordance with embodiments of the invention can be implemented.

Embodiments of the invention allow any solid object or surface to be edited by any arbitrarily oriented and positioned cross-section plane that intersects the object. Solids and surfaces can be modified regardless if they were originally created in the embodiment's CAD system or if they were imported from another CAD system.

In one embodiment, a three-dimensional solid geometry modeling tool is described that can manipulate and modify 3D solids using arbitrarily oriented and positioned 2D cross-sections. The modeling tool (called section mode) allows analytic geometry (including planes, cylinders, cones, and tori) and non-analytic geometry, such as B-spline surfaces, to be manipulated using a simple mouse drag operation on the points and lines on the cross-section plane that comprise the geometry. Operations that can be performed includes moving and offsetting lines to move and offset faces, moving vertices and curves in the cross-section to rotate faces, scaling lines to scale faces, using constraint-based sketch solving to modify 3D geometry, sketch lines and points to create planes and axes, adding points to curves to increase the complexity of surfaces, bending straight lines into arcs to create curved faces, using trimming and extending operations on lines to trim and extend surfaces, moving points on sections of cylinders and cones to adjust the size of the cylinders and cones, and moving parts in the section to move them in 3D. The section mode tool also allows modification to be made with tools similar to those typically used to create and edit two-dimensional geometry that map the 2D input objects (points and lines) with their 3D counterparts (vertices and faces) (e.g., copying lines and parts of lines to create copies of faces and 3D parts, hollowing sections to created shelled solids, splitting and merging sections to split and merge solids, adding points to lines to split faces with new edges, filleting vertices to round edges, deleting lines to remove rounds, chamfers, holes, and other geometry, and adding assembly constraints in the section to apply them in 3D). During modification, the 2D section and 3D solids reflect the changes dynamically as the user interacts with the modeling tool.

In further detail, the section mode tool can be used to edit solids and surfaces with two methods. The first method is that when a 2D cross-section plane intersects a solid, the user can drag the points and lines of the plane to edit the solid. The second method is to map input 2D objects (such as points and lines) to the appropriate 3D objects (such as vertices and faces), and then send the 3D geometry as output to a large set of 3D editing tools. Some examples of the first method are moving and offsetting lines to move and offset faces, moving vertices and curves in the cross-section to rotate faces, scaling lines to scale faces, using constraint-based sketch solving to modify 3D geometry, sketch lines and points to create planes and axes, adding points to curves to increase the complexity of surfaces, bending straight lines into arcs to create curved faces, using trimming and extending operations on lines to trim and extend surfaces, moving points on sections of cylinders and cones to adjust the size of the cylinders and cones, and moving parts in the section to move them in 3D. Some examples of the second method are copying lines and parts of lines to create copies of faces and 3D parts, hollowing sections to created shelled solids, splitting and merging sections to split and merge solids, adding points to lines to split faces with new edges, filleting vertices to round edges, deleting lines to remove rounds, chamfers, holes, and other geometry, and adding assembly constraints in the section to apply them in 3D.

These modifications can be made without the need to completely rebuild the object or deal with various constraints of the modeled object. The term "object" refers to any geometric solid or surface represented within the CAD system. Solid objects are composed of a set of faces that enclose a volume.

Constraint-based sketch solving refers to a common utility that allows connected lines (e.g., lines and arcs connected to form a "racetrack") to maintain their connections, tangencies, radii, and other relationships when they are edited. For example, the curved end of a racetrack sketch might constrain the arc's radius, and connections causing the straight lines to lengthen as an arc is dragged, but no other changes to occur.

When editing objects within the CAD system, the section mode tool takes user-selected edges or vertices and a 2D editing tool as inputs, and delivers the results of the edit in 3D as an output. The objects output by edits with the section mode tool can be edited like any other solid or surface geometry.

Figure 4:
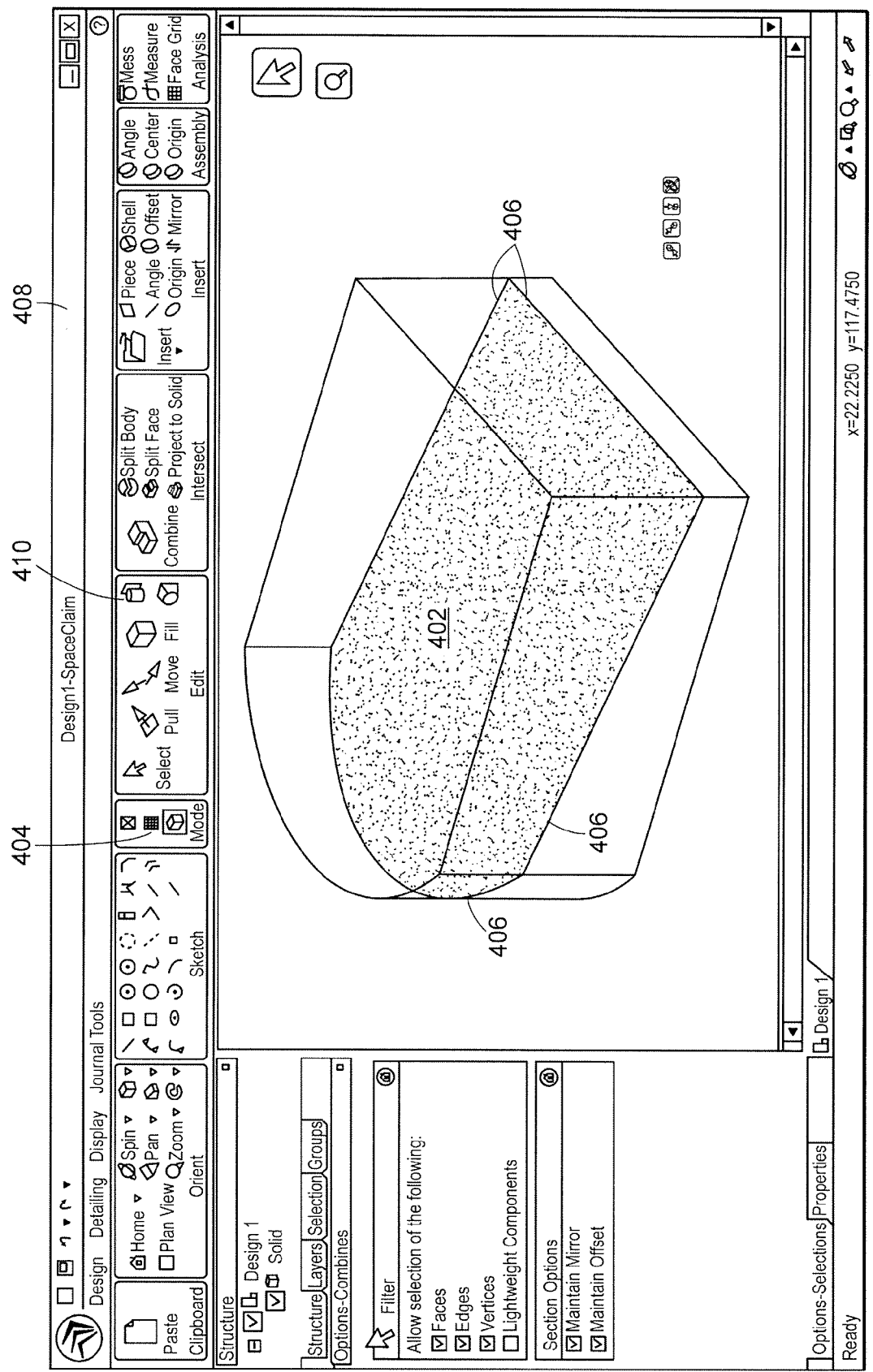
FIG. 4 shows a three-dimensional computer aided design modeling software application containing the section mode tool and displaying an arbitrarily oriented and positioned cross-section that can be used to edit the solid with the section mode tool.
Figure 5:
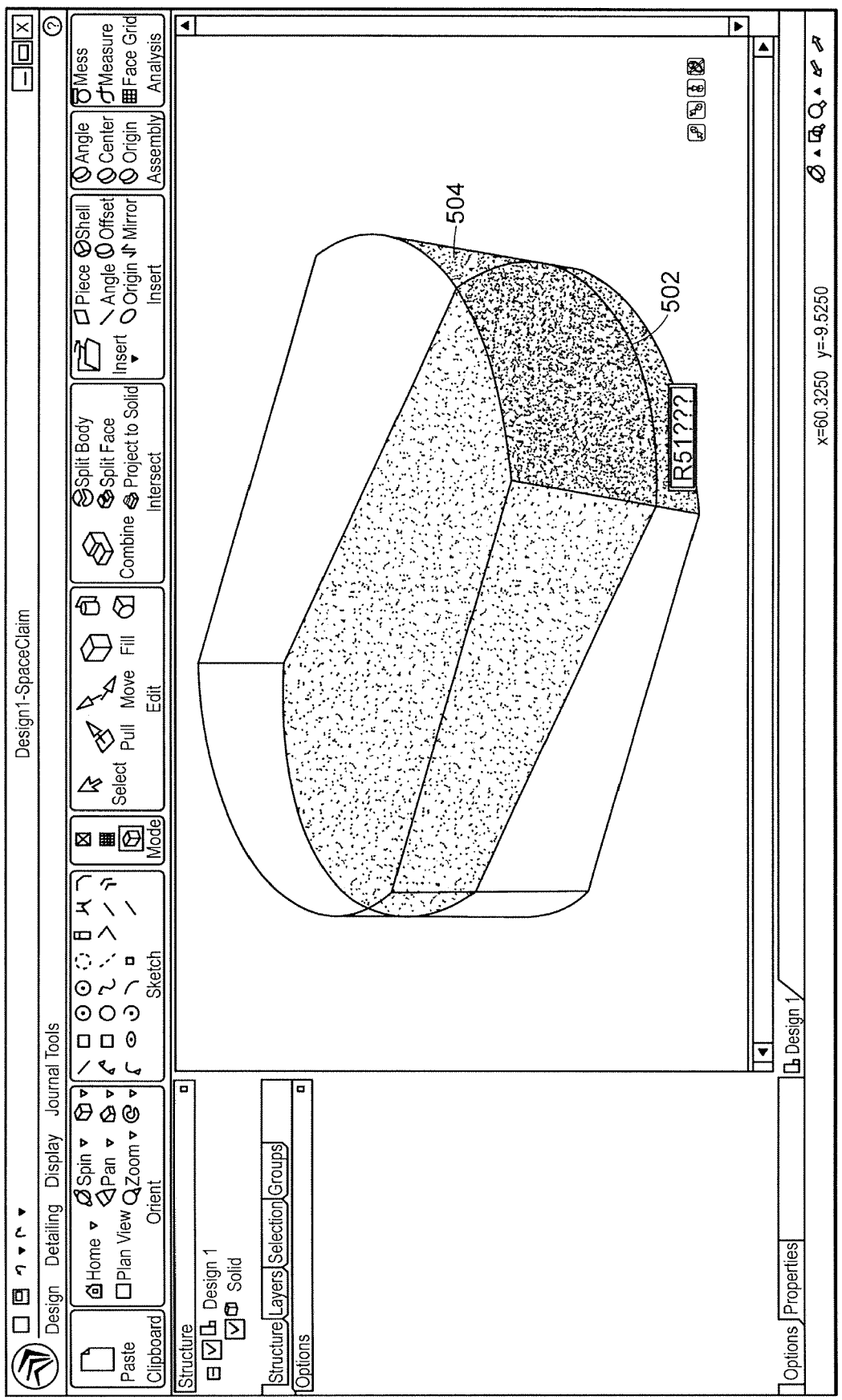
FIG. 5 shows the user editing the geometry by bending a line where the geometry intersects the cross-section plane.

This simple method of editing 3D objects where they intersect with any arbitrarily oriented and positioned cross-section plane is possible because the modeling system used with the combine tools does not maintain a level of history information on top of the geometry information and can therefore show geometry changes immediately. The moment a user selects the object to be edited and the tool to edit with, the program regenerates the object. The simplicity of this method is shown by FIGS. 4 and 5, which shows a user bending a face of an object by selecting a line where the object intersects the cross-section plane and bending it with a bend tool. All edits are performed using the section mode tool in combination with a 2D editing tool, or an alternative method (e.g., keyboard combined with mouse clicks).

FIG. 1 shows a computer system capable of implementing embodiments of the invention. Further details of the overall system and various modification tools are given in the related applications entitled "Method for Modifying Any Modeled Surface As A Lofted Surface," filed Nov. 9, 2007, with Ser. No. 11/937,926, and "Systems and Methods For Merging and Splitting Intersecting Solids and Surfaces," filed Jan. 4, 2008, with Ser. No. 11/969,509, and both of which are herein incorporated by reference in its entirety.

The system includes a computer 181 containing memory and a processor running a standard operating system 182. Running within the operating system 182 with a graphical user interface is a user-level application 183, such as a modeling system that includes a section mode tool in accordance with embodiments of the invention. The operating system and the modeling system are displayed on the monitor 180.

Computer 181 can also have a network interface card and be connected to other computers, servers, and/or storage service. To interface with modeling system 183 a mouse and keyboard (not shown) or other input device can be used. One example of a computer system capable of running the section mode tool is a computer system running Microsoft Windows XP with Service Pack 2 or Windows Vista operating systems. The computer system has a video card, such as those provided by Radeon, NVIDIA, or AMD, with Full DirectX 9c hardware support and 64 MB or more of graphics memory, Pixel shader 2.0 hardware support, 32 bits/pixel, and 1024×768 minimum resolution. The computer system can have a Pentium 4 2.0 GHz or Athlon 2000+ or faster processor, a 32-bit (x86) or 64-bit (x64) processor. The computer system can have between 512 MB and 4 GB of RAM. The system can also have 2 GB of available disk space, a CD/DVD drive, Microsoft Internet Explorer 5.5 or higher, and a 2 button+ wheel mouse.

Figure 2:
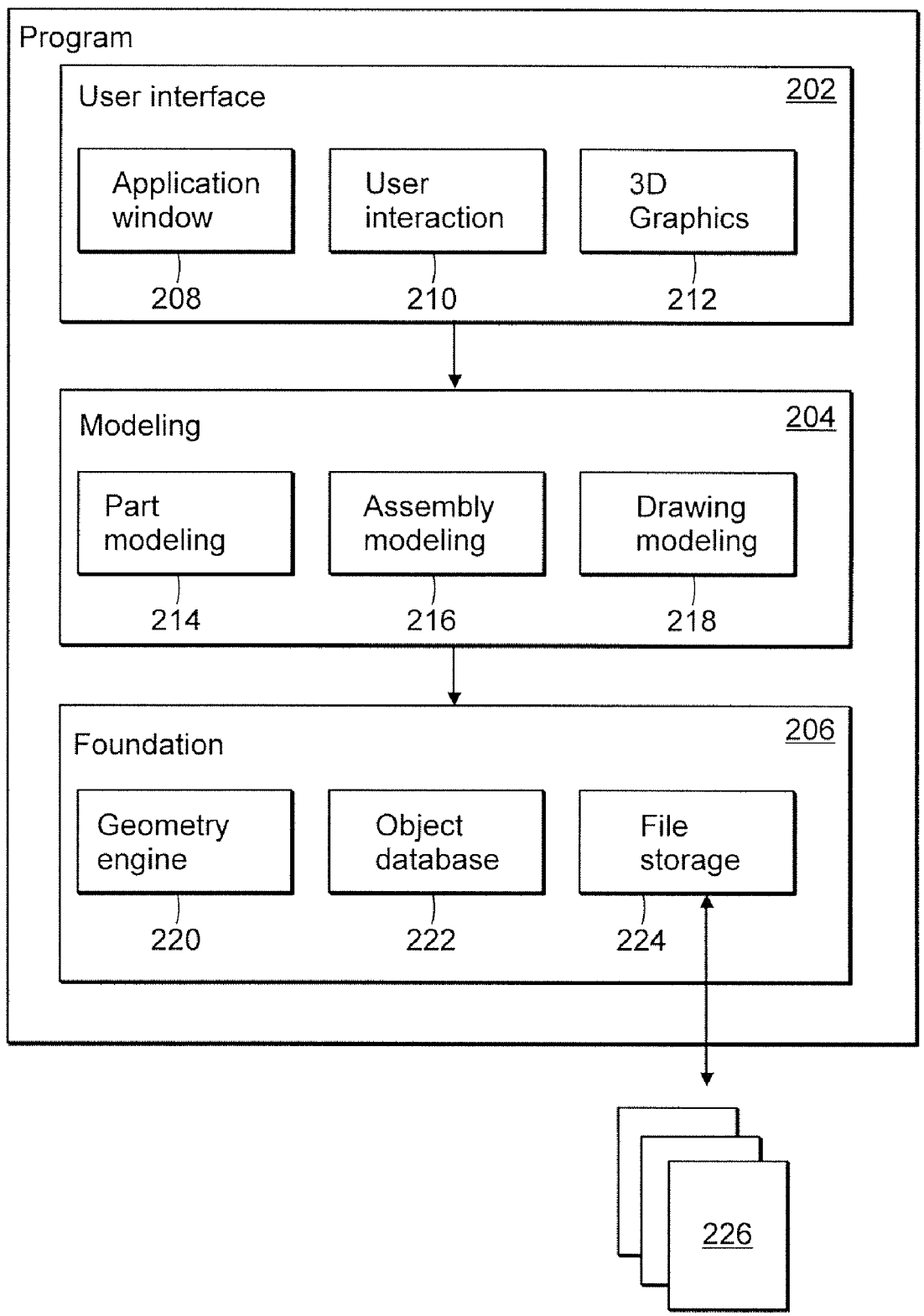
FIG. 2 shows the overall architecture of the computer aided design modeling system and section mode tool.

FIG. 2 is an overall architecture diagram of the structure of the section mode tool within the modeling system in accordance with embodiments of the invention.

The modeling system 183 is made up of a user interface layer 202, a modeling layer 204, and a foundation layer 206. The user interface layer interacts with the user, the modeling layer embodies logic associated with the section mode tool and other tools of the modeling system, and the foundation layer provides geometry modeling and other file services.

The user interface layer 202 is made of an application window 208, which contains the section mode tool widget, and other interface components common to modeling tools that allow a user to interact with the modeling system. It also contains the standard window manipulation features.

User interaction component 210 includes the section mode tool widget and other standard tools for selecting objects, viewing objects in different ways, or obtaining information about objects. Essentially, the user interface layer provides a way for the user to work with the geometry model and the geometry engine, the output of which is displayed on the monitor 180 using a 3D graphics engine 212. 3D graphics engine 212 renders geometry models to the application window 208 for interaction and manipulation by the user. This functionality can be provided by DirectX.

The modeling layer 204 provides the logic and algorithms that underlie the commands and tools in the user interface. It communicates with the geometry engine 220 based on user actions to display the geometry created by the user actions. The geometry engine is a known component capable of performing calculations on objects. One geometry engine compatible with embodiments of the invention is the ACIS geometry engine from Spatial Corporation, although other geometry engines with similar capabilities may also be used. Further details of the ACIS geometry engine are provided in Corney, J and Lim, T, 3D Modeling with ACIS, Stirling, UK, which is hereby incorporated by reference in its entirety.

The modeling layer is made up of part modeling component 214, assembly modeling component 216, and drawing modeling component 218. The part modeling component 214 manages CAD objects and houses creation and manipulation algorithms in the area of 3D solids and 2D sections and sketches.

The assembly modeling component 216 manages CAD objects and algorithms for assembly component instantiation and placement, mating conditions, and the ability to do part modeling in the context of an assembly. Assemblies are user-created collections of parts. The section mode tool can affect parts contained in multiple assemblies.

The drawing modeling component 218 manages CAD objects and algorithms for creating multi-sheet drawings, drawing views, and drawing annotations. Drawings are 2D representations of 3D objects meant to be printed on paper in standard engineering sizes and formats.

The foundation layer 206 provides a software platform used to support higher-level layers of the application. The geometry engine 220 supports the creation and modification of geometry and topology, and provides algorithms for solid modeling and geometric solving. The object database component 222 manages the temporary, in-memory representation of CAD objects, providing a unified framework for inter-object references, undo actions, and associative updates. The file storage component 224 provides persistent storage of CAD objects within document files 226, along with inter-document relationships, such as assembly-component relationships or drawing-format relationships.

Figure 3:
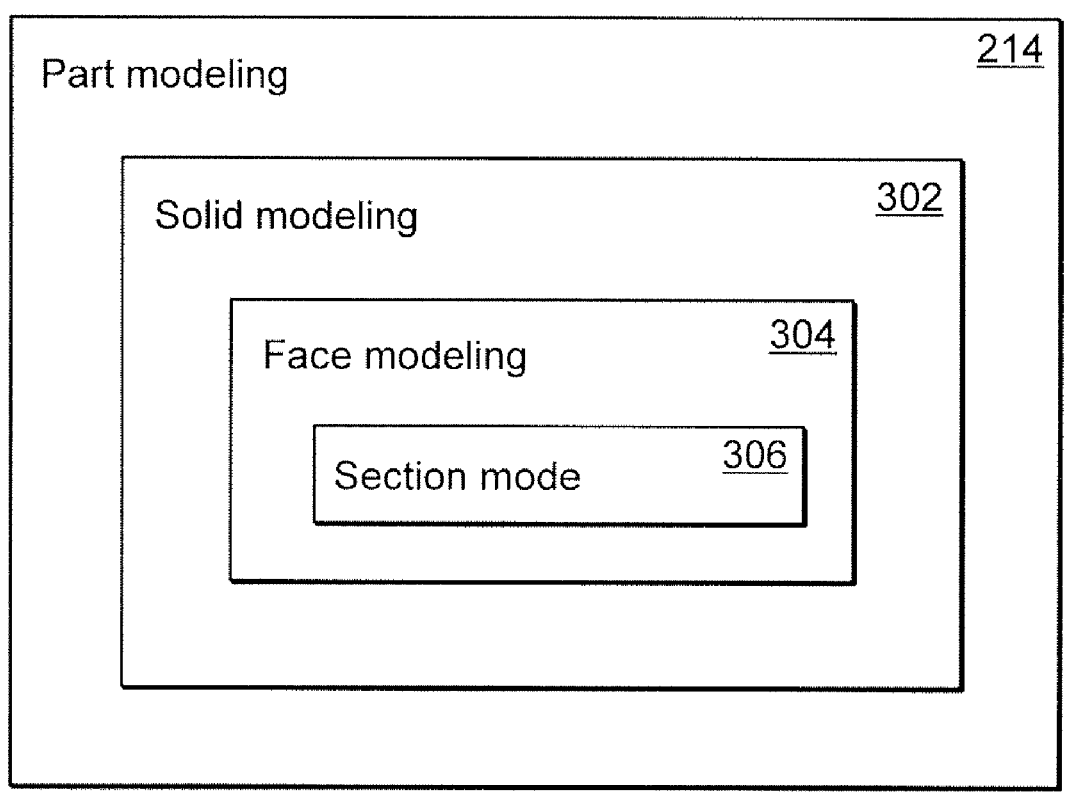
FIG. 3 shows the detailed architecture of the components that contain the section mode tool.

FIG. 3 shows the hierarchy of object modeling components in accordance with the design of the section mode tool.

In the CAD program, multiple solids and surfaces are modeled in the part modeling component 214 which has the necessary algorithms for management and manipulation of 3D solids as well as 2D sections and sketches.

Within the part modeling component is the solid and surface modeling component 302 which is responsible for the management and manipulation of solid objects and surfaces. Unlike parametric, feature-based CAD systems, which make up the majority of the current systems, embodiments of the invention works directly in real time on the solid and surface geometry, as opposed to forcing the user to set up each individual object in a particular feature and then requiring a calculation at the end of the operation. Unlike parametric, feature-based CAD systems, which make up the majority of the current systems, the modeling system works directly on the face geometry in the face modeling component 304. Finally, the section mode component 306 is a subset of the face modeling component and contains the algorithms, including embodiments of the invention, for editing the faces of solids and surfaces based on the changes made to their lines and points that intersect with an arbitrarily oriented and positioned cross-section plane.

Figure 8A:
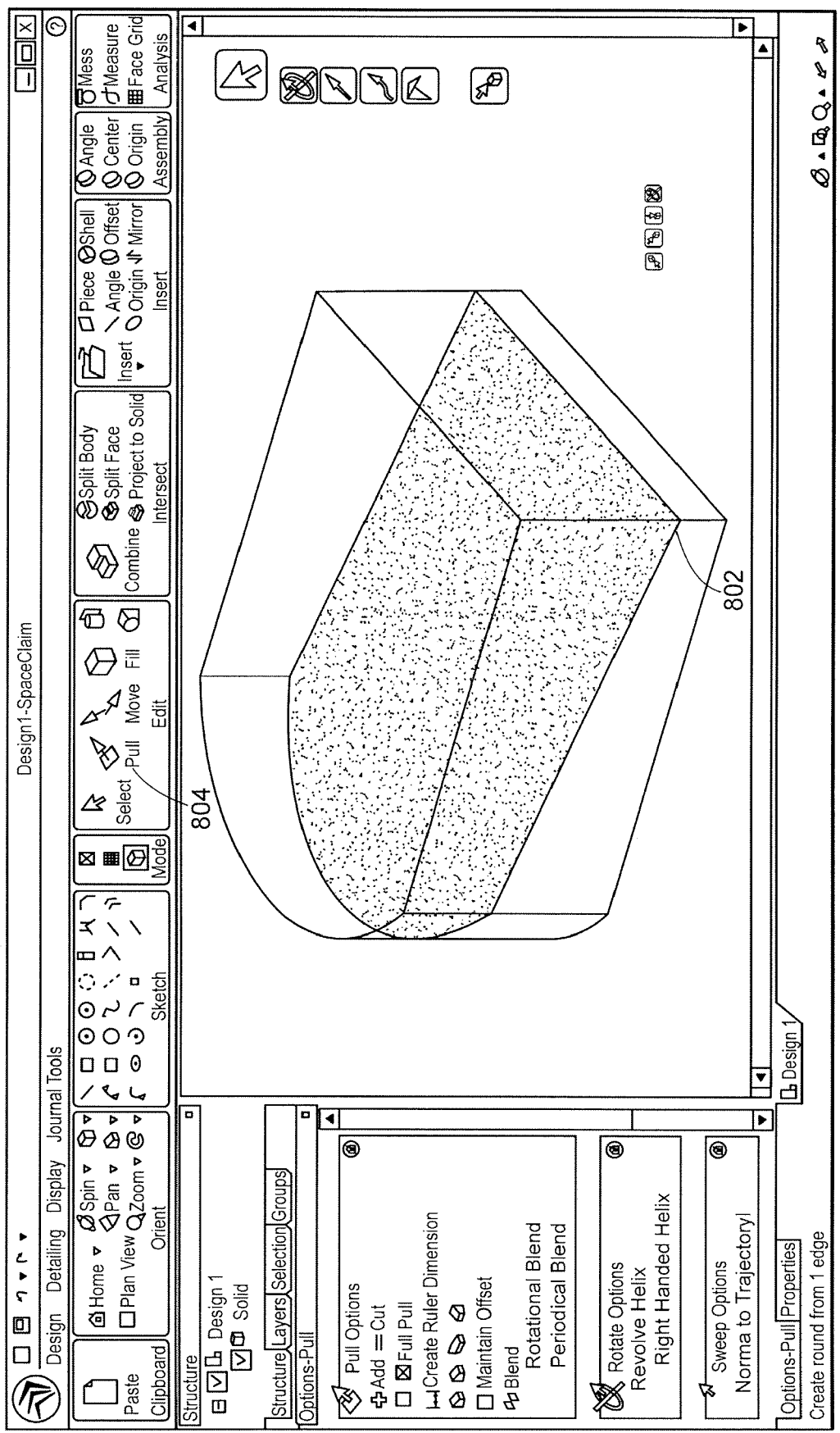
FIG. 8 *a-b* shows the edge of a solid being changed by dragging the point that intersects the cross-section plane to form a round (using the 3D Pull tool in conjunction with the section mode tool).
Figure 8B:
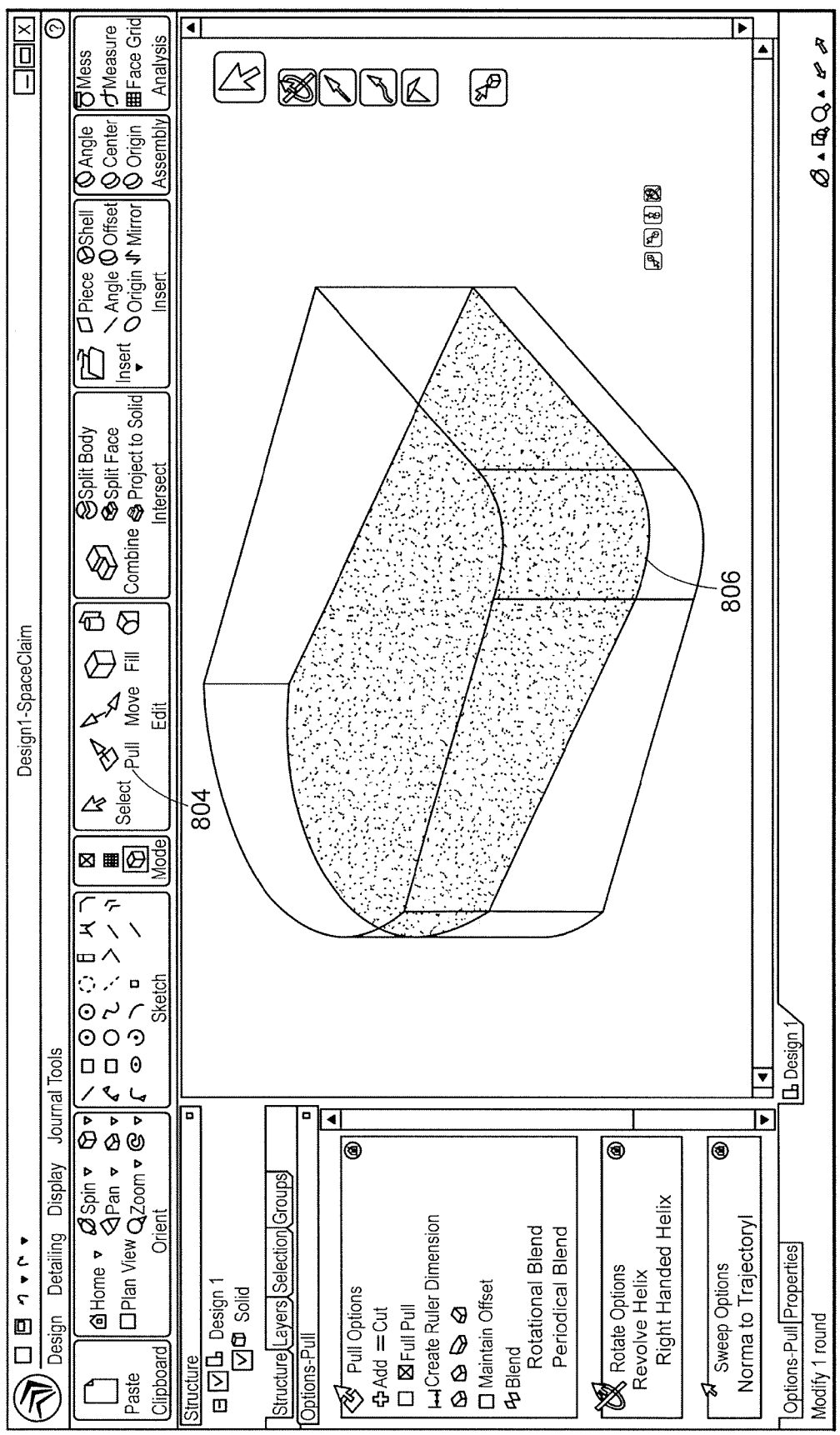
Figure 9A:
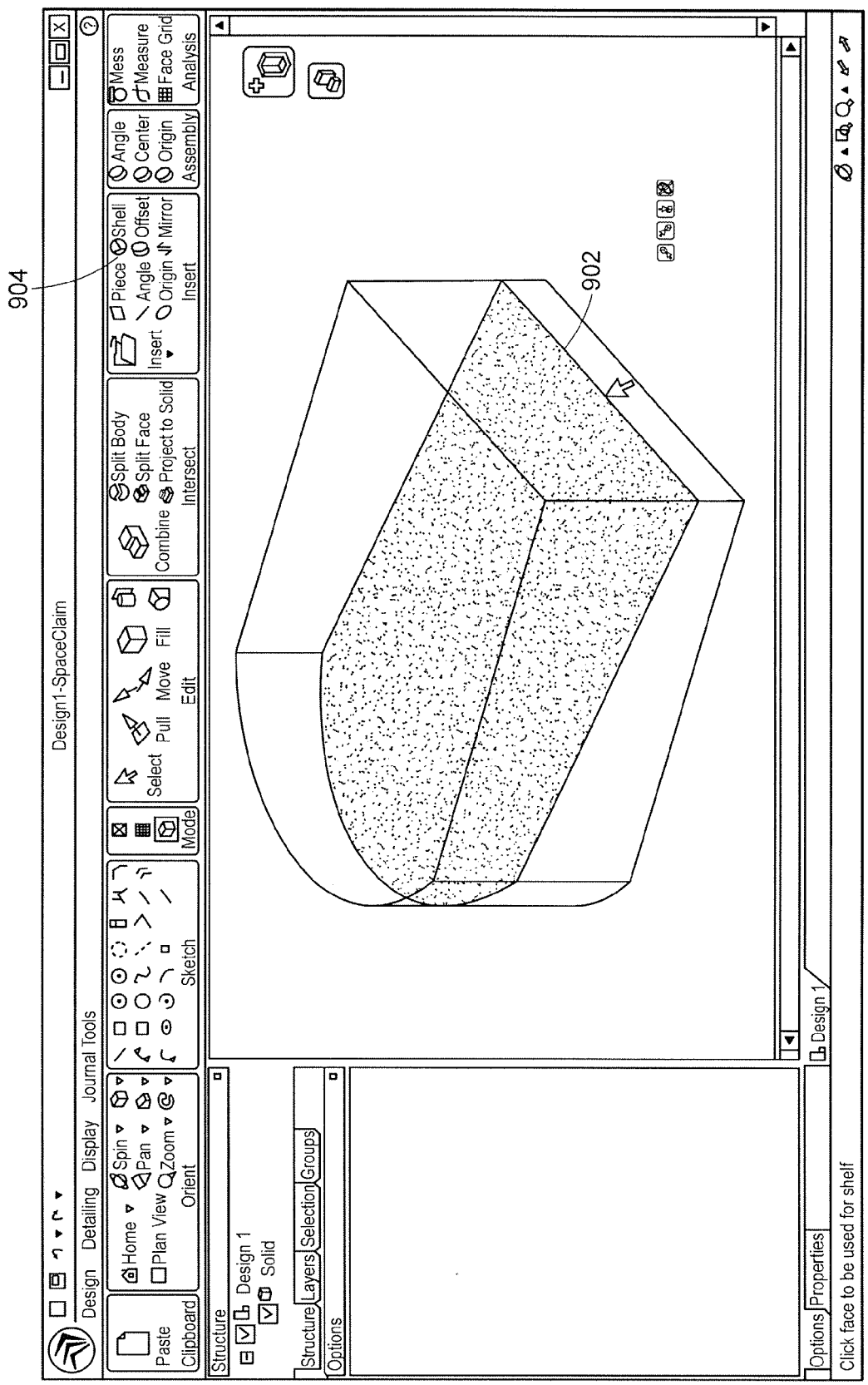
FIG. 9 *a-b* shows a solid being hollowed into a shell using the 3D shell tool in conjunction with the section mode tool.
Figure 9B:
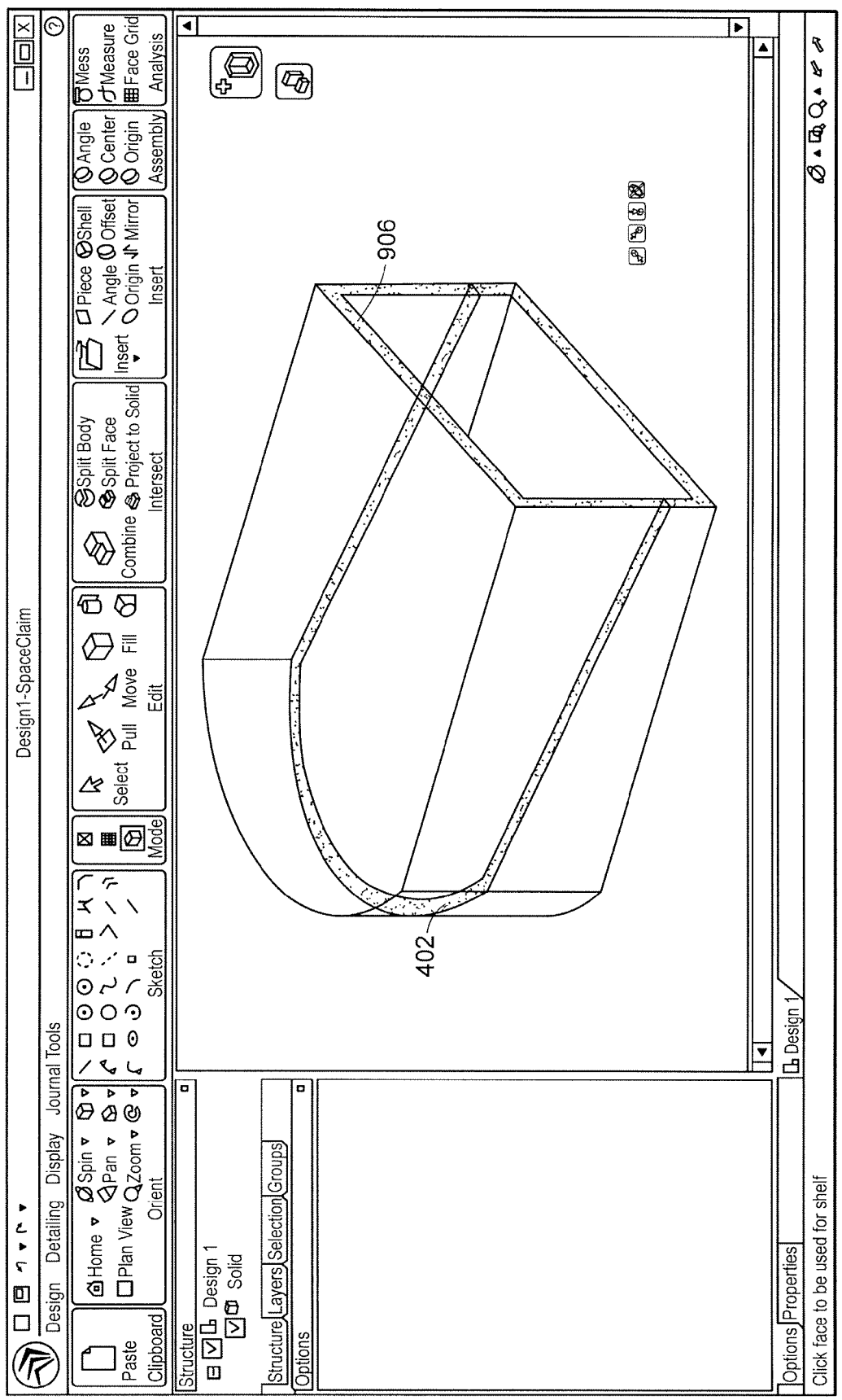

Operation of the section mode tool by a user will now be described with respect to FIGS. 4, 5, 8, and 9. FIGS. 4 and 5 show the face of a solid being bent by changing the line that intersects the cross-section plane to an arc, FIGS. 8*a* and 8*b* show the edge of a solid being changed by dragging the point that intersects the cross-section plane to form a round (using the 3D Pull tool in conjunction with the section mode tool), and FIGS. 9*a* and 9*b* show a solid being hollowed into a shell using the 3D shell tool in conjunction with the section mode tool.

FIG. 4 shows a solid intersected with an arbitrarily oriented and positioned cross-section plane 402 that can be edited using the section mode tool 404 in accordance with embodiments of the invention. The lines where the cross-section plane intersect with the solid 406 are available for editing with any of the system's tools.

The section mode tool can be accessed through many methods, including the use of toolbar buttons 404 within the application window 408 of the overall CAD system. Alternatively, the keyboard could be used to select the section mode tool.

FIG. 5 shows a user bending line 502 with the section mode tool 404 and dragging the mouse with the 2D editing bend tool 410. As the user drags the mouse, the face 504 is redrawn repeatedly, so that the solid appears to be modified in real-time.

FIGS. 8*a* and 8*b* show the edge of a solid being changed by dragging the point that intersects the cross-section plane to form a round (using the 3D Pull tool in conjunction with the section mode tool). FIG. 8*a* shows the user selecting the point 802 with the Pull tool 804 that will become a rounded edge.

FIG. 8*b* shows the user creating a rounded edge 806 by dragging the selected point with the Pull tool 804 in section mode.

FIGS. 9*a* and 9*b* show a solid being hollowed into a shell using the 3D shell tool in conjunction with the section mode tool. FIG. 9*a* shows the user selecting the line 902 representing the face that will be removed with the Shell tool 904.

FIG. 9*b* shows the hollowed-out solid 906 created by the Shell tool 904 in section mode, and the cross section of the newly created hollowed-out solid 402.

The section mode tool can be used to bend, offset, rotate, scale, trim, extend, remove and fill, delete, split and align faces, as well as to round, chamfer, and move edges of a newly created object, an existing object, or an object from another CAD system; if it is from another CAD system, the modeling system uses the foundation layer's geometry engine 220 to convert the imported data from the originating application into a geometry-only format.

The conversion strips all history and feature data, so that the source of the geometry data has no influence. The geometry engine also performs all conversion, checking, and geometry calculation functions. On import, the CAD system retrieves only the final definition of the geometry, and places it into the object database 222. The CAD system creates a new, persistent file with the file storage component 224. If the geometry was imported from another system, the history and parameters used to create the final geometry in that software are ignored.

The import and translation of outside geometry can be performed by the geometry engine through its built-in translators. After importing outside geometry, the geometry-only data is provided to higher-level layers of the system. Although history information and other data from parametric systems has been removed, the geometry still retains information about primitives and relations between objects in the imported geometry.

Figure 6:
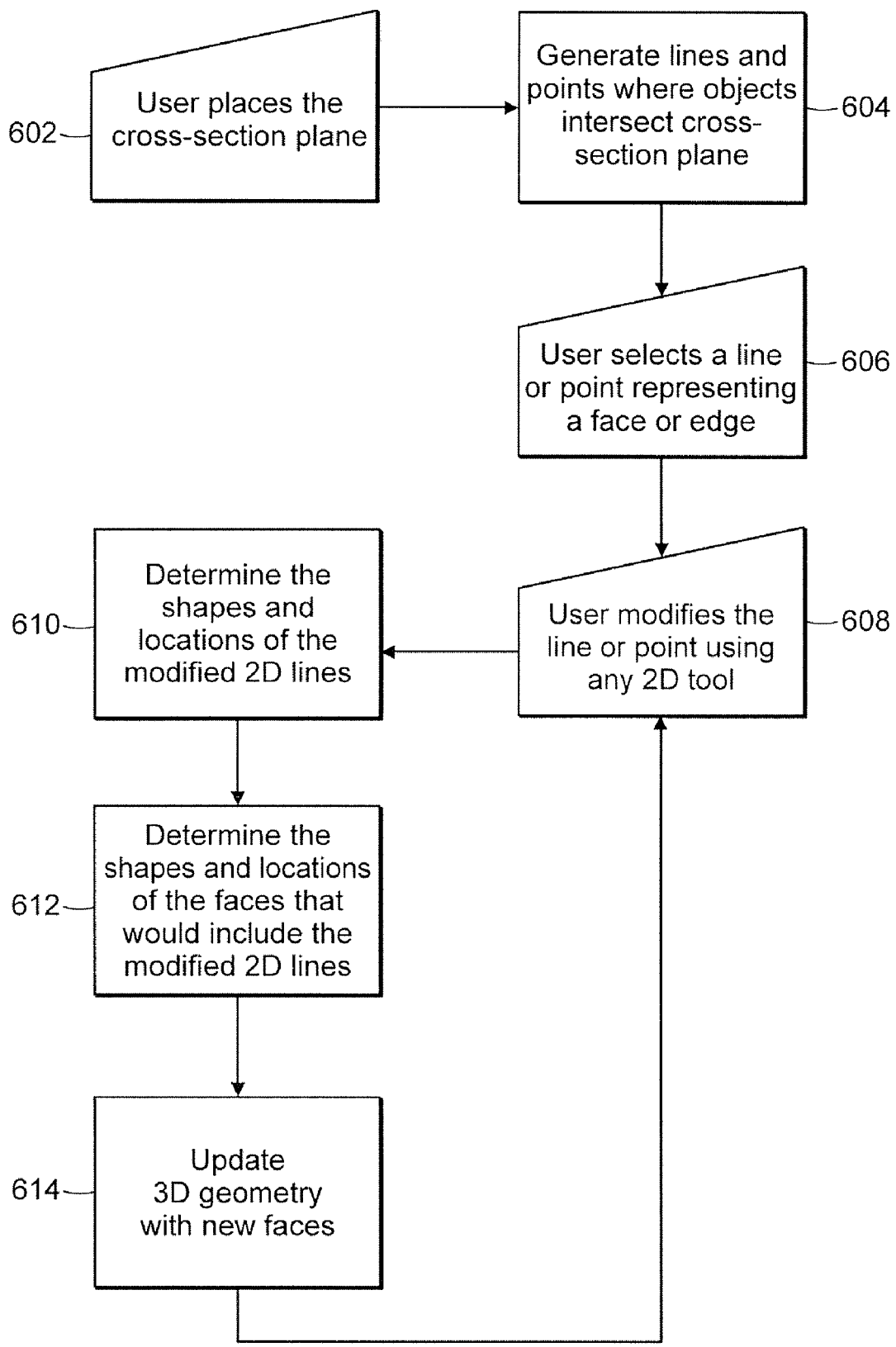
FIG. 6 describes an overview of the back-end logic for implementation of the section mode tool.
Figure 7:
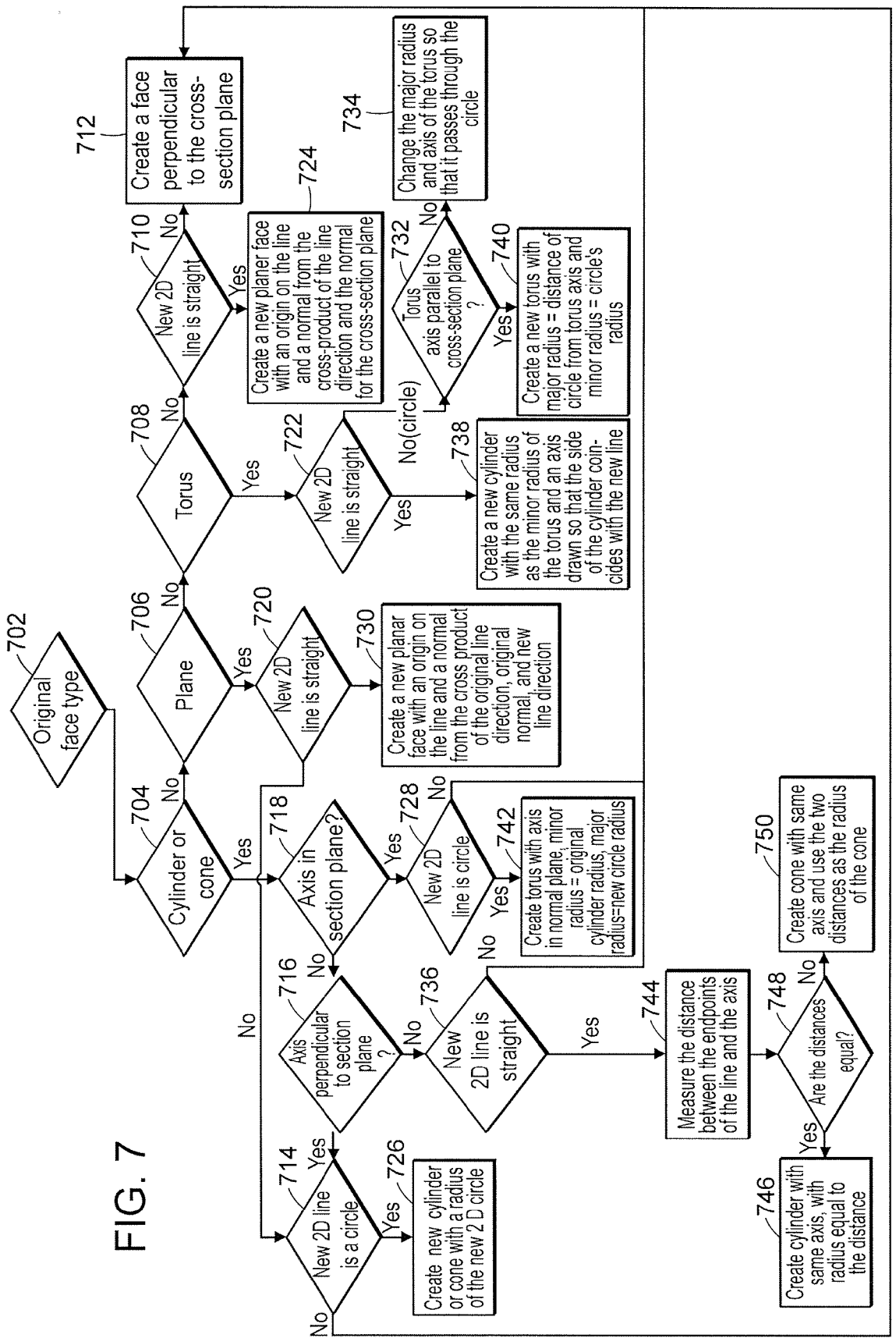
FIG. 7 describes detailed back-end logic for the creation of new faces as the user modifies 2D lines.

The logic of the section mode tool will now be described with respect to FIGS. 6 and 7. FIG. 6 shows an overview of the workflow and logic that implements the editing of geometry by the editing of lines and points where the geometry intersects an arbitrarily oriented and positioned cross-section plane. FIG. 7 shows the detailed logic for how the tool determines the shapes and locations of the faces and edges as the user modifies 2D lines and points.

FIG. 6 shows how a user can edit an object by dragging the lines and points created by the object's intersection with any cross-section plane. When editing an object, the user places the cross-section plane, selects the line or point that represents the face or edge they want to edit, then modifies the object using any 2D editing tool. They system displays the edited solid simultaneously to any mouse movement so that the user sees the solid change immediately upon dragging or clicking with the 2D editing tool.

At step 602, the user places the cross-section plane. The plane can be oriented and moved freely through the 3D design space that contains the geometry. At step 604, the section mode tool generates the lines and points where the cross-section plane and the object intersect. To do this, the tool calls the geometry engine's (220) get intersections function, passing it the plane and the individual faces that comprise the object. The get intersections function returns the lines of intersection for each face. Alternative methods for getting intersections may be used.

At step 606, the user selects the line or point on the cross-section plane that represents the face or edge they want to edit. (Multiple lines and/or points can also be selected simultaneously.) At step 608, the user selects a 2D editing tool and uses it to modify the selected line(s) or point(s).

In response to any mouse movement in step 608, the section mode tool determines the shape and location of the modified 2D lines and points (step 610). The tool does this by communicating with the tools used to modify the 2D lines and points. For example, when the user moves a line by dragging the mouse in the Select tool, the Select tool calculates the vector defined by the mouse location and transforms the curve by that vector, while maintaining tangency and connectivity. The definition of the modified line is then passed to the section mode tool. Line modification is a known component capable of performing calculations on 2D lines and points. One line modification component compatible with embodiments of the invention is the D-cubed 2D dimensional constraint manager from Siemens Corporation, although other line modification components with similar capabilities may also be used. Further details of the D-cubed dimensional constraint manager are provided in J. Owen. Algebraic solution for geometry, Proceedings of the 1st ACM Symposium of Solid Modeling and CAD/CAM applications, pages 397-407, 1991, which is hereby incorporated by reference in its entirety.

In step 612, the tool determines the shapes and locations of the faces and edges that would include the modified 2D lines and points. To do this, the tool uses the logic shown in FIG. 7.

At step 614, the tool updates the 3D geometry with the new faces. First, the tool preserves all relationships with other faces (such as fillet, offset, and mirror relationships), then passes the old face and the new face to the geometry engine's replace face geometry function to replace the old face with the new face. The tool then waits for the user to make the next modification to the line or point (step 608).

For example, in the case of the face being bent via its 2D line in FIGS. 4 and 5, at step 602, the user places the cross-section plane 402. At step 604, the section mode tool generates the lines and points 406 (shown in FIG. 4) where the cross-section plane and the object intersect. At step 606, the user selects the line 502 (shown in FIG. 5) on the cross-section plane that represents the face or edge they want to edit. At step 608, the user selects the Bend tool 410 and uses it to modify the selected line 504 (shown in FIG. 5). At each mouse movement in step 608, the section mode tool determines the shape and location of the modified 2D lines and points (step 610), the shapes and locations of the faces and edges that would include the modified 2D lines and points (step 612), and updates the 3D geometry with the new faces (step 614). Then the tool waits for the next mouse movement.

FIG. 7 shows the detailed logic for determining the faces that include a modified 2D line (step 612 in FIG. 6). At steps 702-708, the section mode tool determines the type of face that contained the original line. If the face is a cylinder or cone, the tool determines the relationship between the axis and the cross-section plane in steps 716 and 718. Next, for all face types, the section mode tool checks whether the new line is linear (straight) or a circle. If the face was originally a cylinder or cone, the axis is not perpendicular to the cross-section plane, and the new line is linear, the tool measures the distance between each endpoint of the new line and the axis of the original cylinder or cone in step 744. If the face was a torus, and the new line is a circle, the tool determines if the torus axis is parallel to the cross-section plane in step 732. Based on all these criteria, the section mode tool creates the appropriate type of face containing the new line. The new face can then be used to update the geometry displayed for the user, as described in step 614 in FIG. 6.

At steps 702-708, the section mode tool determines the face type. To do this, the tool calls a standard function in the geometry engine (220) that queries the face type attribute of the face. All tests (such as those in steps 702-710, 714-722, 728, 732, 736, and 748) are chosen for their simplicity and calculation speed, so that the system can compute changes quickly enough that there is no delay between the drag movement made by the user and the 3D geometry update. This speed is critical if the system is to appear to update geometry in real-time.

If the original face type is determined to be a cylinder or cone at step 704, then the section tool determines whether the axis is in the cross-section plane at step 718. If it is in the cross-section plane, then the tool checks if the new 2D line is a circle at step 728. To do this, the tool samples the line and compares the results against straight lines, arcs, or splines, until a match is found. If it is a circle, then at step 742 the 2D section tool creates a torus with its axis in the plane normal to the cross-section plane, its minor radius equal to the radius of the original cylinder, and its major radius equal to the radius of the new, 2D circle. To do this, the tool calls the geometry engine's (220) new_torus function, passing it the appropriate arguments.

If the new 2D line is not a circle, then at step 712, the section mode tool creates a face through the line and perpendicular to the cross-section plane. To do this, the tool calls the geometry engine's (220) new_plane function, passing it the 2D line. The new_plane function returns the face.

If the original face type is determined to be a cylinder or cone at step 704, and the axis is determined not to be in the cross-section plane at step 718, the tool checks whether the axis is perpendicular to the cross-section plane at step 716. If the axis is perpendicular to the cross-section plane, then the tool checks if the new 2D line is a circle at step 714. To do this, the tool samples the line and compares the results against straight lines, arcs, or splines, until a match is found. If it is a circle, then at step 726 the 2D section tool creates a new cylinder or cone with the radius of the new, 2D circle. If the new 2D line is not a circle, then at step 712, the section mode tool creates a face through the line and perpendicular to the cross-section plane. To do this, the tool calls the geometry engine's (220) new_plane function, passing it the 2D line. The new_plane function returns the face.

If the original face type is determined to be a cylinder or cone at step 704, and the axis is determined not to be in the cross-section plane (step 718) or perpendicular to it at step 716, then the tool checks if the new 2D line is a straight line at step 714. To do this, the tool samples the line and compares the results against straight lines, arcs, or splines, until a match is found. If it is a straight line, then at step 744 the tool measures the distance between the start point of the line and the axis, and measures the distance between the end point of the line and the axis. At step 748, the tool checks to see if these two distances are equal. If they are, then the section mode tool creates a cylinder using the same axis as the original face, and sets the radius to the distance between the axis and the new, 2D line's endpoint. To do this, the tool calls the geometry engine's (220) new_cylinder function, passing it axis and the radius. If the two distances are different, the tool creates a cone using the same axis as the original face, and using the two distances as the radii of the cone. To do this, the tool calls the geometry engine's (220) new_cone function, passing it the axis and the two radii. If the new 2D line is not a straight line, then at step 712, the section mode tool creates a face through the line and perpendicular to the cross-section plane. To do this, the tool calls the geometry engine's (220) new_spline function, passing it the 2D line.

If the original face type is determined to be a plane at step 706, then the tool checks if the new 2D line is a straight line at step 720. If it is not a straight line, an error is produced. If it is a straight line, then at step 730 the section mode tool creates a planar face with an origin on the line and a normal created from the cross product of the original line direction, original normal, and new line direction. To do this, the tool calls the geometry engine's (220) new_plane function, passing it the appropriate arguments.

If the original face type is determined to be a torus at step 708, then the tool checks if the new 2D line is a straight line at step 722. If it is a straight line, then at step 738 the section mode tool creates a new cylindrical face with the same radius as the minor radius of the torus and an axis drawn so that the side of the cylinder coincides with the new line. To do this, the tool calls the geometry engine's (220) new_cylinder function, passing it the appropriate arguments.

If the original face type is determined to be a torus at step 708, and the line is determined to be not straight (and is a circle) at step 722, then at step 732, the tool checks to see if the axis of the torus is parallel to the cross-section plane. If the axis is parallel, then at step 740 the tool creates a new torus with the major radius equal to the distance of the circle's center from the torus axis and with the minor radius equal to the circle's radius. To do this, the tool calls the geometry engine's (220) new_torus function, passing it the torus and the circle. If the axis is not parallel, then the tool creates a new torus where the major radius and axis of the torus passes through the circle. To do this, the tool calls the geometry engine's (220) new_torus function, passing it the torus and the circle of the new minor radius (the major radius is left unchanged).

If the original face type is not a cylinder, cone, plane, or torus, then the section mode tool checks if the new 2D line is straight at step 728. To do this, the tool samples the line and compares the results against straight lines, arcs, or splines, until a match is found. If it is straight, then at step 724 the tool creates a new planar face with an origin on the line and a normal calculated from the cross product of the line direction and the normal of the cross-section plane. To do this, the tool calls the geometry engine's (220) new_plane function, passing it the original planar face and the new, 2D line.

If the new 2D line is not straight, then at step 712, the section mode tool creates a face through the line and perpen-dicular to the cross-section plane. To do this, the tool calls the geometry engine's (220) new_spline function, passing it the 2D line.

This entire process is repeated for each face affected by the change in the 2D line.

For example, in the case of the face being bent via its 2D line in FIGS. 4 and 5, in steps 702 and 706, the original face that contains line 502 (see FIG. 5 and the original face in FIG. 4) is determined to be a plane. Next, the tool checks in step 720 whether the new 2D line 502 is straight. Since it is not, step 714 checks if it is a circle. Since the line is part of a circle (that is, an arc), the tool creates a new cylindrical face 504 in step 726 (shown in FIG. 5). In this case, only one face is affected so the tool proceeds to step 608 in FIG. 6.

While the above description contains many specificities, these should not be construed as limitations on the scope of any embodiment, but as exemplifications of the presently preferred embodiments thereof. Many other ramifications and variations are possible within the teachings of the various embodiments.

What is claimed:

1. A method for modifying the geometry data of a geometry-only format solid boundary representation 3D CAD object through modification of an arbitrary cross section, the solid boundary representation 3D CAD object being stored within a computer aided design modeling system without related history information, the method comprising:
   (a) displaying a plurality of solid boundary representation 3D CAD objects, each with a corresponding position and orientation within the three dimensional modeling space of the computer aided design modeling system, and displayed within a graphical user interface of the computer aided design modeling system;
   (b) receiving, from a user of the computer aided design modeling system, the position and orientation of a cross section plane within the three dimensional modeling space of the computer aided design modeling system, the cross section plane being arbitrarily positioned relative to the orientation of one of the solid boundary representation 3D CAD objects, and wherein the arbitrarily positioned and oriented plane is intersecting the solid boundary representation 3D CAD object;
   (c) the computer aided design modeling system generating a user modifiable two dimensional cross section from the intersection of the cross section plane and the solid boundary representation 3D CAD object, wherein the cross section plane is arbitrarily positioned and oriented relative to the solid boundary representation 3D CAD object, and wherein the generated two dimensional cross section comprises a plurality of user modifiable control elements;
   (d) receiving a modification to at least one of the user modifiable control elements, and making a corresponding modification to the two dimensional cross section in response to the modification to the control element; and
   (e) updating the geometry data of the solid boundary representation 3D CAD object such that changes to the two dimensional cross section are reflected in the updated geometry of the solid boundary representation 3D CAD object, and performing such updates without recording history information.

2. The method of claim 1, wherein the user modifiable control elements are comprised of a plurality of points and a plurality of lines.

3. The method of claim 1, wherein the modification is made using a two dimensional geometry modification tool.

4. The method of claim 1, wherein the modification is made using a three dimensional geometry modification tool.

5. The method of claim 1, wherein the modification is made using a two dimensional geometry modification tool, and the modification comprises at least one of moving a line, bending a line, trimming a line, and deleting a line.

6. The method of claim 1, wherein the modification is made using a three dimensional geometry modification tool, and the modification comprises at least one of hollowing the two dimensional cross section, splitting the two dimensional cross section, and merging the two dimensional cross section.

7. The method of claim 1, wherein step (e) comprises creating a new face based on the change to the two dimensional cross section; and updating the geometry data of the solid boundary representation 3D CAD object using the new face.

8. The method of claim 7, wherein creating a new face based on the modification to the two dimensional cross section comprises determining the original face the modified control elements belong to, and generating the new face from the original face.

9. The method of claim 1, wherein step (e) further comprises:
immediately redisplaying the modified two dimensional cross section and the updated solid boundary representation 3D CAD object within the graphical user interface of the computer aided design modeling system;
receiving an additional modification, from the user, to at least one of the plurality of user modifiable control elements, and based on the additional modification; and
immediately redisplaying the modified two dimensional cross section and the updated solid boundary representation 3D CAD object within the graphical user interface of the computer aided design modeling system based on the additional modification.

10. A system for modifying the geometry data of a geometry-only format solid boundary representation 3D CAD object through modification of an arbitrary cross section, the solid boundary representation 3D CAD object being stored within a computer aided design modeling system without related history information, the system comprising:
(a) a display with a graphical user interface for displaying a plurality of solid boundary representation 3D CAD objects, each with a corresponding position and orientation within the three dimensional modeling space of the computer aided design modeling system;
(b) the computer aided design modeling system receiving, from a user of the computer aided design modeling system, the position and orientation of a cross section plane within the three dimensional modeling space of the computer aided design modeling system, the cross section plane being arbitrarily positioned relative to the orientation of one of the solid boundary representation 3D CAD objects, and wherein the arbitrarily positioned and oriented plane is intersecting the solid boundary representation 3D CAD object;
(c) the computer aided design modeling system generating a user modifiable two dimensional cross section from the intersection of the cross section plane and the solid boundary representation 3D CAD object, wherein the cross section plane is arbitrarily positioned and oriented relative to the solid boundary representation 3D CAD object, and wherein the generated two dimensional cross section comprises a plurality of user modifiable control elements;
(d) the computer aided design modeling system, through the graphical user interface, receiving a modification to at least one of the user modifiable control elements, and making a corresponding modification to the two dimensional cross section in response to the modification to the control element, and wherein the geometry data of the solid boundary representation 3D CAD object is updated to reflect the updated solid boundary representation 3D CAD object geometry, and performing such updates without recording history information.

11. The system of claim 10, wherein the user modifiable control elements are comprised of a plurality of points and a plurality of lines.

12. The system of claim 10, wherein the modification is made using a two dimensional geometry modification tool.

13. The system of claim 10, wherein the modification is made using a three dimensional geometry modification tool.

14. The system of claim 10, wherein the modification is made using a two dimensional geometry modification tool, and the modification comprises at least one of moving a line, bending a line, trimming a line, and deleting a line.

15. The system of claim 10, wherein the modification is made using a three dimensional geometry modification tool, and the modification comprises at least one of hollowing the two dimensional cross section, splitting the two dimensional cross section, and merging the two dimensional cross section.

16. The system of claim 10, wherein step (d) comprises creating a new face based on the change to the two dimensional cross section; and updating the geometry data of the solid boundary representation 3D CAD object using the new face.

17. The system of claim 16, wherein creating a new face based on the modification to the two dimensional cross section comprises determining the original face the modified control elements belong to, and generating the new face from the original face.

18. The system of claim 10, wherein step (d) further comprises:
immediately redisplaying the modified two dimensional cross section and the updated solid boundary representation 3D CAD object within the graphical user interface of the computer aided design modeling system;
receiving an additional modification, from the user, to at least one of the plurality of user modifiable control elements, and based on the additional modification; and
immediately redisplaying the modified two dimensional cross section and the updated solid boundary representation 3D CAD object within the graphical user interface of the computer aided design modeling system based on the additional modification.

* * * * *